United States Patent
Zhang

(10) Patent No.: US 9,823,510 B2
(45) Date of Patent: Nov. 21, 2017

(54) QUANTUM DOT COLOR FILM SUBSTRATE, MANUFACTURING METHOD THEREOF AND LCD APPARATUS

(71) Applicant: Shenzhen China Star Optoelectronics Technology Co., Ltd., Shenzhen (CN)

(72) Inventor: Xia Zhang, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 197 days.

(21) Appl. No.: 14/908,540

(22) PCT Filed: Dec. 24, 2015

(86) PCT No.: PCT/CN2015/098643
§ 371 (c)(1),
(2) Date: Jan. 29, 2016

(87) PCT Pub. No.: WO2017/075879
PCT Pub. Date: May 11, 2017

(65) Prior Publication Data
US 2017/0269434 A1    Sep. 21, 2017

(30) Foreign Application Priority Data
Nov. 5, 2015    (CN) .......................... 2015 1 0747048

(51) Int. Cl.
*G02B 5/20*    (2006.01)
*G02F 1/1335*    (2006.01)
(Continued)

(52) U.S. Cl.
CPC .... *G02F 1/133617* (2013.01); *C23C 14/0629* (2013.01); *C23C 14/3407* (2013.01);
(Continued)

(58) Field of Classification Search
CPC . G03F 7/0007; G02B 5/201; G02F 1/133512; G02F 1/133514; G02F 1/133516; G02F 1/133603; G02F 1/133621
(Continued)

(56) References Cited

U.S. PATENT DOCUMENTS

2010/0141875 A1* 6/2010 Shim ................ G02F 1/133514
349/106
2014/0132890 A1* 5/2014 Zhang .............. G02F 1/133514
349/69
(Continued)

FOREIGN PATENT DOCUMENTS

CN    203465442 U    3/2014

*Primary Examiner* — John A McPherson
(74) *Attorney, Agent, or Firm* — Leong C. Lei

(57) ABSTRACT

The invention provides a quantum dot color film substrate, manufacturing method thereof and an LCD apparatus. The manufacturing method comprises forming an organic transparent photo-resist layer on transparent sub-pixel areas of a transparent substrate; forming a red quantum dot layer, a green quantum dot layer on corresponding red sub-pixel areas and green sub-pixel areas respectively by a sputter printing process using the organic transparent layer as stop walls to improve printing precision. The manufacturing method is simple, and requires less time and facility cost.

10 Claims, 4 Drawing Sheets

(51) Int. Cl.
  *C23C 14/34* (2006.01)
  *C23C 14/06* (2006.01)
  *G03F 7/00* (2006.01)
  *B82Y 20/00* (2011.01)

(52) U.S. Cl.
  CPC ....... *G02B 5/201* (2013.01); *G02F 1/133512* (2013.01); *G02F 1/133514* (2013.01); *G02F 1/133516* (2013.01); *G02F 1/133603* (2013.01); *G02F 1/133621* (2013.01); *G03F 7/0007* (2013.01); *B82Y 20/00* (2013.01); *G02F 2001/133614* (2013.01); *Y10S 977/774* (2013.01); *Y10S 977/95* (2013.01); *Y10S 977/952* (2013.01)

(58) Field of Classification Search
  USPC .............................................. 430/7; 349/106
  See application file for complete search history.

(56) References Cited

U.S. PATENT DOCUMENTS

| | | | |
|---|---|---|---|
| 2014/0192294 A1* | 7/2014 | Chen | F21V 9/08 349/69 |
| 2016/0357068 A1* | 12/2016 | Yang | G02F 1/133504 |
| 2017/0031205 A1* | 2/2017 | Lee | G02F 1/133502 |

* cited by examiner

QUANTUM DOT COLOR FILM SUBSTRATE, MANUFACTURING METHOD THEREOF AND LCD APPARATUS

BACKGROUND OF THE INVENTION

1. Field of the Invention

The present invention relates to the field of display, and in particular to a quantum dot color film substrate, manufacturing method and an LCD apparatus.

2. The Related Arts

The thin film transistor liquid crystal display (TFT-LCD) is the mainstream technology in the tablet display field due to the advantages of high chroma, small size, and low power-consumption. The color filter (CF), which is one of the important elements in the LCD apparatus, mainly uses the red, green and blue (RGB) color layer to filter to achieve displaying color. The RGB color layer conventional TFT-LCD is formed by photo-lithography process, which has the complex process, time-consuming issues. Also, the color photo-resist layer has a low utilization of the backlight and the hue and color saturation of the display cannot be greatly enhanced because of the material restriction.

As the display technology progresses, the demands on the display quality also grow. The quantum dots (QD) refers to the semiconductor die with diameter between 1-100 nm. Because QD has a small diameter less than or closer to the exciton Bohr radius of corresponding material to generate quantum confinement effect. The continuous band gap structure of the material will transform into discrete energy level structure. Under the excitation of the external light source, the electron transits and emits fluorescent.

The discrete energy level structure of the QD material makes a narrower half wave width to emit a high purity light of single color, and shows a higher light-emitting efficiency when compared to conventional display. Moreover, because the QD band gap is affected by the size, the ability to control light color by QD material size, structure or composition adjustment. To meet the demands on the display for wide color domain and high color saturation, an effective option for the manufacturers is to add photoluminescence QD element to the backlight structure.

SUMMARY OF THE INVENTION

The object of the present invention is to provide a manufacturing method for quantum dot color film substrate, by using sputter printing to form QD layer. The process is simple, brief and requires low cost facility.

Another object of the present invention is to provide a QD color film substrate, for improving opening ratio and the light utilization of the display, to realize high color domain and low power-consumption of the display.

Another object of the present invention is to provide an LCD apparatus, which comprises a QD color film substrate, with high opening ratio and the light utilization of the display, to realize high color domain and low power-consumption of the display.

To achieve the above object, the present invention provides a manufacturing method for QD color film substrate, which comprises: Step 1: providing a transparent substrate, dividing the transparent substrate into a plurality of pixel areas, with each pixel area comprising a red sub-pixel area, a green sub-pixel area, and a transparent sub-pixel area; on the transparent substrate, the red sub-pixel area and the green sub-pixel area being separated by the transparent sub-pixel area, with each red sub-pixel area located between two transparent sub-pixel areas, and each green sub-pixel area being located between two transparent sub-pixel areas; Step 2: forming a patterned organic transparent photo-resist layer on the corresponding transparent sub-pixel areas on the transparent substrate; Step 3: using the organic transparent photo-resist layer as a stop wall, forming a patterned red quantum dot layer on the corresponding red sub-pixel areas of the transparent substrate by sputter printing process, forming a patterned green quantum dot layer on the corresponding green sub-pixel areas of the transparent substrate by sputter printing process to obtain a color filter layer comprising an organic transparent photo-resist layer, a red quantum dot layer, a green quantum dot layer; Step 4: forming a transparent conductive layer on the color filter layer; Step 5: forming a black photo-resist layer on the transparent conductive layer.

In Step 3, to prevent overflowing, the thickness of the red quantum dot layer and the green quantum dot layer is less than the organic transparent photo-resist layer by 0.01-2 um.

The black photo-resist layer comprises a black matrix, a main spacer disposed on the black matrix, and an auxiliary spacer on the black matrix.

The main spacer is disposed according to the black matrix on the organic transparent photo-resist layer, and the auxiliary space is disposed according to the black matrix on the red quantum dot layer and the green quantum dot layer.

In Step 2, the material for the organic transparent photo-resist layer is a transparent photo-resist material with UV curing property, a transparent photo-resist with thermal curing property, or a transparent photo-resist with both UV curing property and thermal curing property; the organic transparent photo-resist layer is formed by a photo lithography process.

In Step 3, the red quantum dot layer and the green quantum dot layer are formed with a quantum dot ink comprising a red quantum dot material and a green quantum dot material respectively; the quantum dot ink having a viscosity of 1-40 cp, and surface tension of 30-70 dy/cm.

The quantum dot material in the quantum dot ink comprises one or more of II-VI group quantum dot material, and I-III-VI group quantum dot material.

The ratio between the area AT of the transparent sub-pixel area and the area AR of the red sub-pixel area is $0.05 \leq AT/AR \leq 0.5$; and the ratio between the area AR of the red sub-pixel area and the area AG of the green sub-pixel area is $0.3 \leq AR/AG \leq 1$.

The present invention also provides a color film substrate, which comprises a transparent substrate, a color filter layer disposed on the transparent substrate, a transparent conductive layer disposed on the color filter layer, and a black photo-resist layer disposed on the transparent conductive layer; the transparent substrate comprising a plurality of pixel areas, with each pixel area comprising a red sub-pixel area, a green sub-pixel area, and a transparent sub-pixel area; on the transparent substrate, the red sub-pixel area and the green sub-pixel area being separated by the transparent sub-pixel area, with each red sub-pixel area located between two transparent sub-pixel areas, and each green sub-pixel area being located between two transparent sub-pixel areas; the color filter layer comprising an organic transparent photo-resist layer, a red quantum dot layer and a green quantum dot layer disposed on the transparent sub-pixel area, the red sub-pixel area and the green sub-pixel area, respectively; the red quantum dot layer and the green quantum dot layer being formed with a quantum dot ink comprising a red quantum dot material and a green quantum dot material respectively by a sputter printing process using the organic transparent photo-resist layer as a stop wall.

The present invention also provides an LCD apparatus, which comprises an LCD panel, and a backlight module disposed below the LCD panel; the LCD panel comprising the aforementioned color film substrate, an array substrate, and a liquid crystal (LC) layer disposed between the color film substrate and the array substrate; and the light source of the backlight module being a blue light-emitting diode (LED), with a wavelength between 450-480 nm.

Compared to the known techniques, the present invention provides the following advantages: the present invention provides a quantum dot color film substrate, manufacturing method thereof and an LCD apparatus. The method comprises forming organic transparent photo-resist layer on transparent sub-pixel areas of a transparent substrate; forming red quantum dot layer, green quantum dot layer on corresponding red sub-pixel areas and green sub-pixel areas respectively by sputter printing process using organic transparent layer as stop wall to improve printing precision. The method is simple, and requires less time and facility cost. In the quantum dot color film substrate, the color filter layer which comprises organic transparent photo-resist layer, red quantum dot layer, green quantum dot layer; the organic transparent photo-resist layer able to directly display the blue backlight to improve opening ratio and light utilization of the display; the red quantum dot layer and the green quantum dot layer comprises quantum dot material to achieve high purity color to realize high color domain and low energy-consumption and improve opening ratio and light utilization of the display. The LCD apparatus uses the above quantum dot color film substrate to improve opening ratio and light utilization of the display, and shows high contrast and saturation of colors.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

To further explain the technical means and effect of the present invention, the following refers to embodiments and drawings for detailed description.

Figure 1:
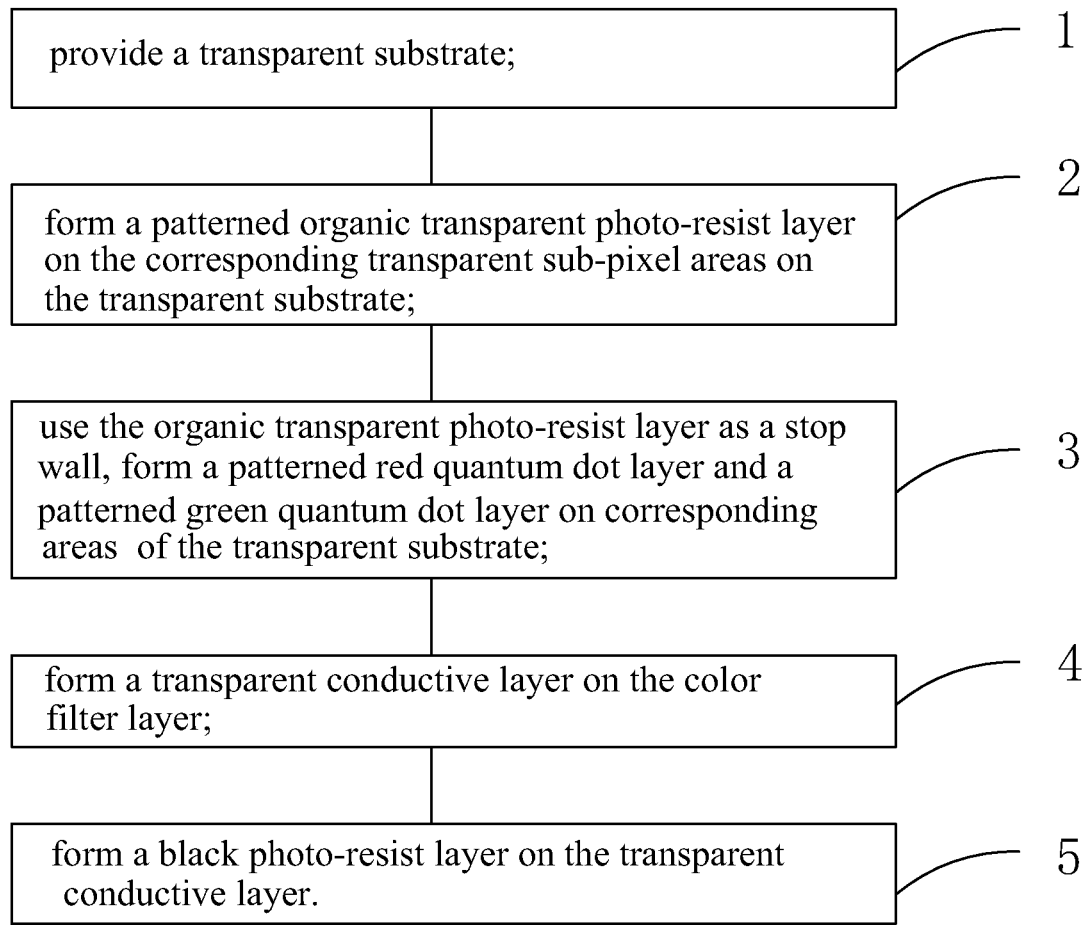
FIG. 1 is a schematic view showing the flowchart of the manufacturing method for quantum dot color film substrate provided by an embodiment of the present invention.

Refer to FIG. 1. The present invention provides a manufacturing method for quantum dot color film substrate, which comprises:

Step 1: providing a transparent substrate 11.

Dividing the transparent substrate 11 into a plurality of pixel areas, with each pixel area comprising a red sub-pixel area, a green sub-pixel area, and a transparent sub-pixel area; on the transparent substrate 11, the red sub-pixel area and the green sub-pixel area being separated by the transparent sub-pixel area, with each red sub-pixel area located between two transparent sub-pixel areas, and each green sub-pixel area being located between two transparent sub-pixel areas.

Specifically, when the quantum dot color film is applied to the display for displaying, the white dot color coordinates are adjusted to within the target range ($0.25<x<0.35$, $0.24<y<0.35$), and controlling the ratio between the area AT of the transparent sub-pixel area and the area AR of the red sub-pixel area to be within $0.05 \leq AT/AR \leq 0.5$; and the ratio between the area AR of the red sub-pixel area and the area AG of the green sub-pixel area to within $0.3 \leq AR/AG \leq 1$.

Figure 2:
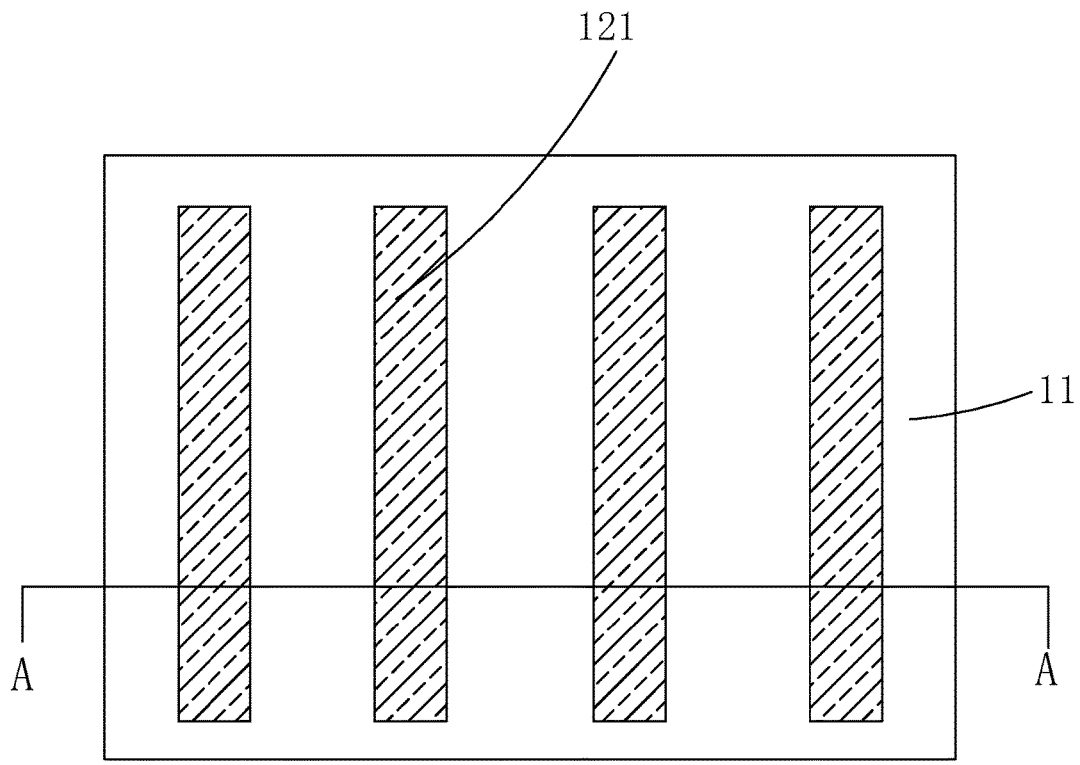
FIG. 2 is a schematic view showing step 2 of forming organic transparent photo-resist layer in the manufacturing method for quantum dot color film substrate provided by an embodiment of the present invention.
Figure 3:
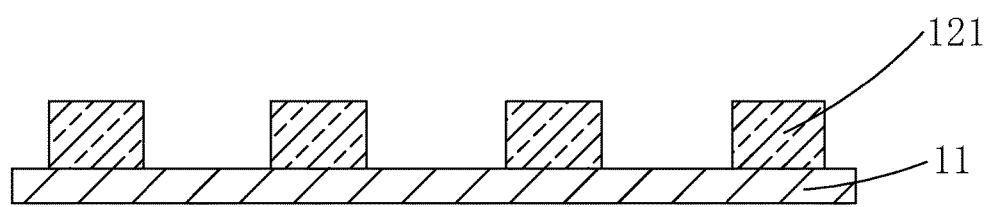
FIG. 3 is a cross-sectional view showing step 2 of forming organic transparent photo-resist layer along the A-A direction in the manufacturing method for quantum dot color film substrate provided by an embodiment of the present invention.

Step 2: as shown in FIGS. 2-3, forming a patterned organic transparent photo-resist layer 121 on the corresponding transparent sub-pixel areas on the transparent substrate 11.

Specifically, in Step 2, the material for the organic transparent photo-resist layer 121 is a transparent photo-resist material with UV curing property, a transparent photo-resist with thermal curing property, or a transparent photo-resist with both UV curing property and thermal curing property; the organic transparent photo-resist layer 121 is formed by a photo lithography process.

Step 3: using the organic transparent photo-resist layer 121 as a stop wall, forming a patterned red quantum dot layer 122 on the corresponding red sub-pixel areas of the transparent substrate 11 by sputter printing process, forming a patterned green quantum dot layer 123 on the corresponding green sub-pixel areas of the transparent substrate 11 by sputter printing process to obtain a color filter layer 12 comprising an organic transparent photo-resist layer 121, a red quantum dot layer 122, a green quantum dot layer 123.

Specifically, as shown in FIGS. 2-3, after Step 2, each red sub-pixel area and green sub-pixel area are located between the stop walls formed by two organic transparent photo-resist layers 121; with the organic transparent photo-resist layer 121 as stop walls for sputter printing, the printing precision is greatly improved.

Specifically, in Step 3, after sputter printing, a step of UV curing or thermal curing is performed to cure the red quantum dot layer 122 and the green quantum dot layer 123.

Specifically, in Step 3, to prevent overflowing, the thickness of the red quantum dot layer 122 and the green quantum dot layer 123 is less than the organic transparent photo-resist layer 121 by 0.01-2 um.

Specifically, the red quantum dot layer 122 and the green quantum dot layer 123 are formed with a quantum dot ink comprising a red quantum dot material and a green quantum dot material respectively; the quantum dot ink having a viscosity of 1-40 cp, and surface tension of 30-70 dy/cm.

Specifically, the quantum dot material in the quantum dot ink comprises one or more of II-VI group quantum dot material, and I-III-VI group quantum dot material. Preferably, the quantum dot material comprises one or more of CdSe, CdS, CdTe, ZnS, ZnSe, CuInS, ZnCuInS. The structure of the quantum dot material can be ball shape, core shell shape, ball-like shape with protruding, irregular shape, and so on.

Step 4: forming a transparent conductive layer 13 on the color filter layer 12.

Figure 5:
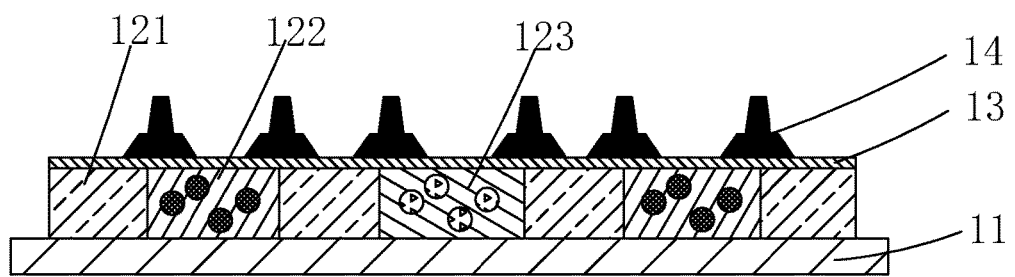
FIG. 5 is a schematic view showing the quantum dot color film substrate provided by an embodiment of the present invention.

Step 5: forming a black photo-resist layer 14 on the transparent conductive layer 14 to obtain a quantum dot color film substrate as shown in FIG. 5.

Figure 4:
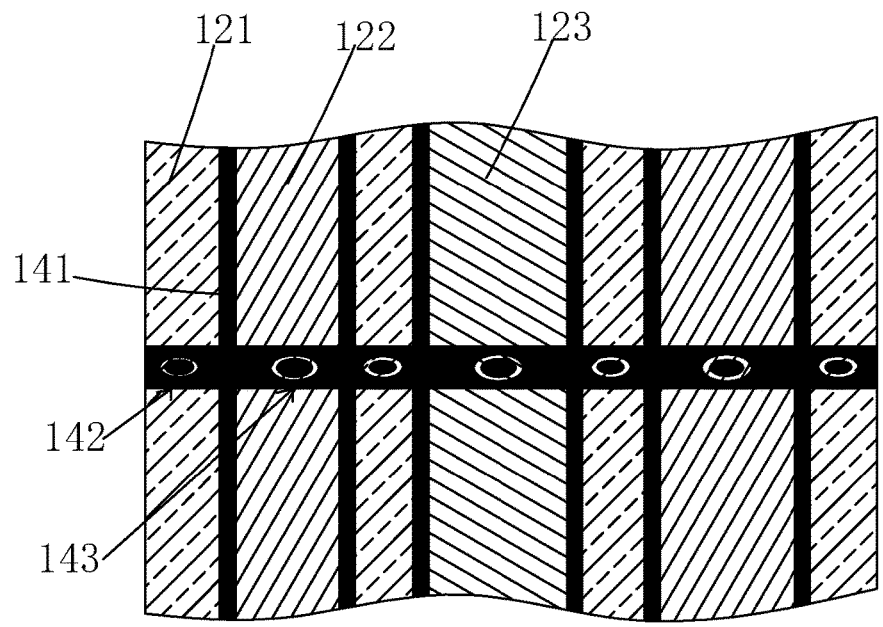
FIG. 4 is a schematic view showing step 5 of the manufacturing method for quantum dot color film substrate provided by an embodiment of the present invention.

Specifically, as shown in FIG. 4, the black photo-resist layer 14 comprises a black matrix 141, a main spacer 142 disposed on the black matrix 141, and an auxiliary spacer 143 on the black matrix 141.

Specifically, the black matrix 141 is for shielding the overlapped areas between the sub-pixel areas to prevent color mixing. The main spacer 142 and the auxiliary spacer 143 are for controlling the thickness and uniformity between the upper and lower substrates.

Specifically, the main spacer 142 is disposed according to the black matrix 141 on the organic transparent photo-resist layer 121, and the auxiliary space 143 is disposed according to the black matrix 141 on the red quantum dot layer 122 and the green quantum dot layer 123. In the quantum dot color film substrate, because the organic transparent photo-resist layer 121 is used as stop walls, the thickness of the film is slightly higher than the film thickness of the red quantum dot layer 122 and the green quantum dot layer 123. The black photo-resist layer 14 formed in subsequent step can use this feature as advantage to dispose the main spacer 142 at the location with higher film thickness without other additional design to achieve a larger difference in height between the main spacer 142 and the auxiliary spacer 143.

In a preferred embodiment of the manufacturing method for quantum dot color film substrate, the thickness of the organic transparent photo-resist layer 121 is 4 um in Step 2; to prevent overflowing, the thickness of the red quantum dot layer 122 is less than the organic transparent photo-resist layer 121 by 0. 2 um; and the thickness of the green quantum dot layer 123 is less than the organic transparent photo-resist layer 121 by 0. 2 um. Moreover, when the quantum dot color film is applied to the display for displaying, the white dot color coordinates are adjusted to within the target range (0.25<x<0.35, 0.24<y<0.35), and controlling the ratio between the area AT of the transparent sub-pixel area and the area AR of the red sub-pixel area to be AT/AR=0.5; and the ratio between the area AR of the red sub-pixel area and the area AG of the green sub-pixel area to be AR/AG=1.

Based on the above manufacturing method for quantum dot color film substrate, the present invention also provides a color film substrate, with a structure as shown in FIG. 5, which comprises: a transparent substrate 11, a color filter layer 12 disposed on the transparent substrate 11, a transparent conductive layer 13 disposed on the color filter layer 12, and a black photo-resist layer 14 disposed on the transparent conductive layer 13.

The transparent substrate 11 comprises a plurality of pixel areas, with each pixel area comprising a red sub-pixel area, a green sub-pixel area, and a transparent sub-pixel area; on the transparent substrate 11, the red sub-pixel area and the green sub-pixel area being separated by the transparent sub-pixel area, with each red sub-pixel area located between two transparent sub-pixel areas, and each green sub-pixel area being located between two transparent sub-pixel areas.

The color filter layer 12 comprises an organic transparent photo-resist layer 121, a red quantum dot layer 122 and a green quantum dot layer 123 disposed on the transparent sub-pixel area, the red sub-pixel area and the green sub-pixel area, respectively.

The red quantum dot layer 122 and the green quantum dot layer 123 are formed with a quantum dot ink comprising a red quantum dot material and a green quantum dot material respectively by a sputter printing process using the organic transparent photo-resist layer 121 as a stop wall.

Specifically, the thickness of the red quantum dot layer 122 and the green quantum dot layer 123 is less than the organic transparent photo-resist layer 121 by 0.01-2 um.

Specifically, the black photo-resist layer 14 comprises a black matrix 141, a main spacer 142 disposed on the black matrix 141, and an auxiliary spacer 143 on the black matrix 141.

Specifically, the main spacer 142 is disposed according to the black matrix 141 on the organic transparent photo-resist layer 121, and the auxiliary space 143 is disposed according to the black matrix 141 on the red quantum dot layer 122 and the green quantum dot layer 123.

Specifically, the material for the organic transparent photo-resist layer 121 is a transparent photo-resist material with UV curing property, a transparent photo-resist with thermal curing property, or a transparent photo-resist with both UV curing property and thermal curing property; the organic transparent photo-resist layer 121 is formed by a photo lithography process.

Specifically, the quantum dot ink has a viscosity of 1-40 cp, and surface tension of 30-70 dy/cm.

Specifically, the quantum dot material in the quantum dot ink comprises one or more of II-VI group quantum dot material, and I-III-VI group quantum dot material. Preferably, the quantum dot material comprises one or more of CdSe, CdS, CdTe, ZnS, ZnSe, CuInS, ZnCuInS. The structure of the quantum dot material can be ball shape, core shell shape, ball-like shape with protruding, irregular shape, and so on.

Specifically, when the quantum dot color film is applied to the display for displaying, the white dot color coordinates are adjusted to within the target range (0.25<x<0.35, 0.24<y<0.35), and controlling the ratio between the area AT of the transparent sub-pixel area and the area AR of the red sub-pixel area to be within $0.05 \leq AT/AR \leq 0.5$; and the ratio between the area AR of the red sub-pixel area and the area AG of the green sub-pixel area to within $0.3 \leq AR/AG \leq 1$.

Figure 6:
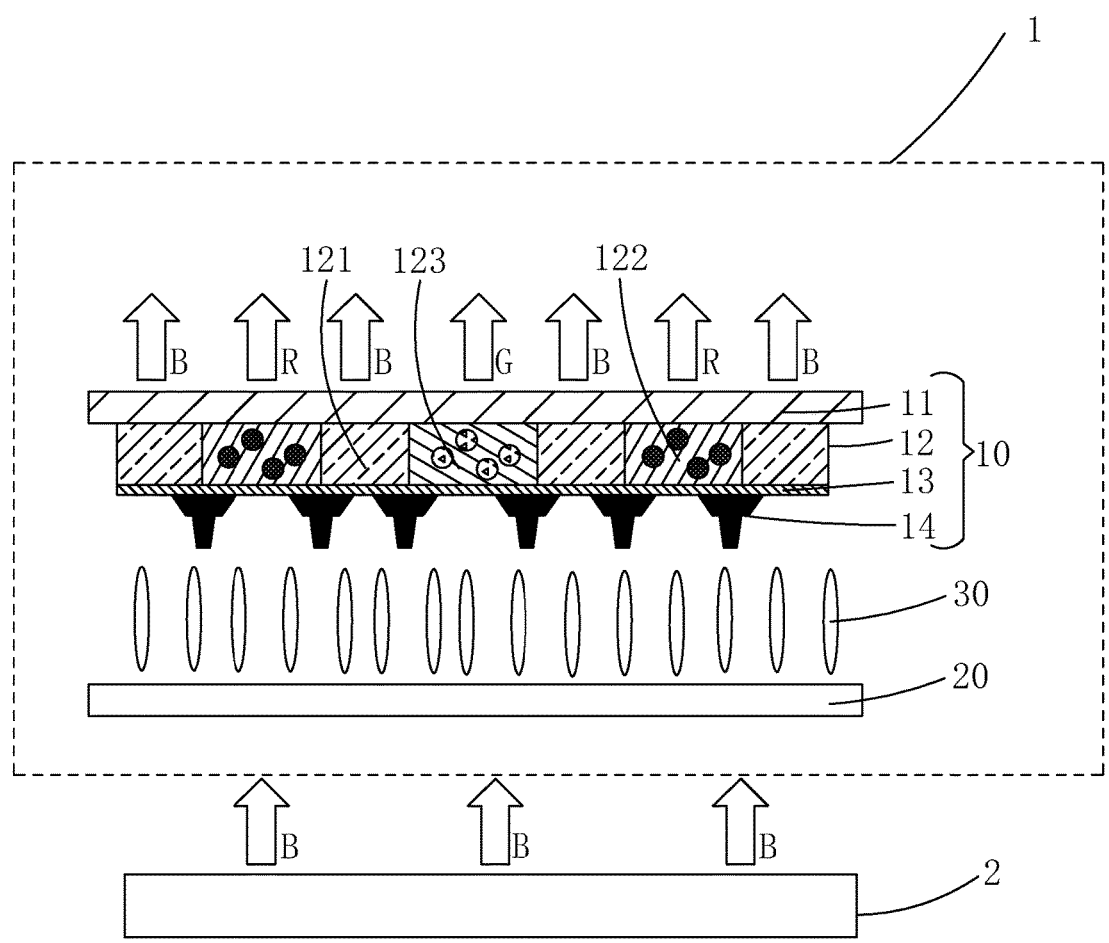
FIG. 6 is a schematic view showing the LCD apparatus provided by an embodiment of the present invention.

Based on the above quantum dot color film substrate, as shown in FIG. 6, the present invention also provides an LCD apparatus, which comprises an LCD panel 1, and a backlight module 2.

The LCD panel comprises an aforementioned quantum dot color film substrate 10, an array substrate 20, and a liquid crystal (LC) layer 30 disposed between the quantum dot color film substrate 10 and the array substrate 20.

The light source of the backlight module 2 is a blue light-emitting diode (LED), with a wavelength between 450-480 nm.

In the LCD apparatus of the present invention, the organic transparent photo-resist layer 121 corresponds to a sub-pixel area, able to allow the blue backlight to pass through, and effectively increase the opening ratio of the display to improve light utilization. The red quantum dot layer 122 and the green quantum dot layer 123 comprise quantum dot material, and can improve light utilization when compared to the conventional red photo-resist and green photo-resist. By using the characteristics of narrow half wave width of light when the quantum dot material is excited, a high purity light can be obtained to achieve high color domain and low power-consumption for display.

Specifically, the LCD apparatus can be a large-size LCD, LC TV or a small- to medium-size mobile phone, tablet PC, digital camera or other special-purpose display, such as, e-book.

In summary, the present invention provides a quantum dot color film substrate, manufacturing method thereof and an LCD apparatus. The method comprises forming organic transparent photo-resist layer on transparent sub-pixel areas of a transparent substrate; forming red quantum dot layer, green quantum dot layer on corresponding red sub-pixel areas and green sub-pixel areas respectively by sputter printing process using organic transparent layer as stop wall to improve printing precision. The method is simple, and requires less time and facility cost. In the quantum dot color film substrate, the color filter layer which comprises organic transparent photo-resist layer, red quantum dot layer, green quantum dot layer; the organic transparent photo-resist layer able to directly display the blue backlight to improve opening ratio and light utilization of the display; the red quantum dot layer and the green quantum dot layer comprises quantum dot material to achieve high purity color to realize high color domain and low energy-consumption and improve opening ratio and light utilization of the display. The LCD apparatus uses the above quantum dot color film substrate to improve opening ratio and light utilization of the display, and shows high contrast and saturation of colors.

It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a . . . " does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A manufacturing method for quantum dot (QD) color film substrate, which comprises:
    Step 1: providing a transparent substrate,
        dividing the transparent substrate into a plurality of pixel areas, with each pixel area comprising a red sub-pixel area, a green sub-pixel area, and a transparent sub-pixel area; on the transparent substrate, the red sub-pixel area and the green sub-pixel area being separated by the transparent sub-pixel area, with each red sub-pixel area located between two transparent sub-pixel areas, and each green sub-pixel area being located between two transparent sub-pixel areas;
    Step 2: forming a patterned organic transparent photo-resist layer on the corresponding transparent sub-pixel areas on the transparent substrate;
    Step 3: using the organic transparent photo-resist layer as a stop wall, forming a patterned red quantum dot layer on the corresponding red sub-pixel areas of the transparent substrate by sputter printing process, forming a patterned green quantum dot layer on the corresponding green sub-pixel areas of the transparent substrate by sputter printing process to obtain a color filter layer comprising an organic transparent photo-resist layer, a red quantum dot layer, a green quantum dot layer;
    Step 4: forming a transparent conductive layer on the color filter layer; and
    Step 5: forming a black photo-resist layer on the transparent conductive layer.

2. The manufacturing method for QD color film substrate as claimed in claim 1, wherein in Step 3, to prevent overflowing, the thickness of the red quantum dot layer and the green quantum dot layer is less than the organic transparent photo-resist layer by 0.01-2 um.

3. The manufacturing method for QD color film substrate as claimed in claim 2, wherein the black photo-resist layer comprises a black matrix, a main spacer disposed on the black matrix, and an auxiliary spacer on the black matrix.

4. The manufacturing method for QD color film substrate as claimed in claim 3, wherein the main spacer is disposed according to the black matrix on the organic transparent photo-resist layer, the auxiliary space is disposed according to the black matrix on the red quantum dot layer and the green quantum dot layer.

5. The manufacturing method for QD color film substrate as claimed in claim 1, wherein in Step 2, the material for the organic transparent photo-resist layer is a transparent photo-resist material with UV curing property, a transparent photo-resist with thermal curing property, or a transparent photo-resist with both UV curing property and thermal curing property; the organic transparent photo-resist layer is formed by a photo lithography process.

6. The manufacturing method for QD color film substrate as claimed in claim 1, wherein in Step 3, the red quantum dot layer and the green quantum dot layer are formed with a quantum dot ink comprising a red quantum dot material and a green quantum dot material respectively; the quantum dot ink having a viscosity of 1-40 cp, and surface tension of 30-70 dy/cm.

7. The manufacturing method for QD color film substrate as claimed in claim 6, wherein the quantum dot material in the quantum dot ink comprises one or more of II-VI group quantum dot material, and I-III-VI group quantum dot material.

8. The manufacturing method for QD color film substrate as claimed in claim 1, wherein the ratio between the area AT of the transparent sub-pixel area and the area AR of the red sub-pixel area is 0.05≤AT/AR≤0.5; and the ratio between the area AR of the red sub-pixel area and the area AG of the green sub-pixel area is 0.3≤AR/AG≤1.

9. A quantum dot (QD) color film substrate, which comprises: a transparent substrate, a color filter layer disposed on the transparent substrate, a transparent conductive layer disposed on the color filter layer, and a black photo-resist layer disposed on the transparent conductive layer;
    the transparent substrate comprising a plurality of pixel areas, with each pixel area comprising a red sub-pixel area, a green sub-pixel area, and a transparent sub-pixel area; on the transparent substrate, the red sub-pixel area and the green sub-pixel area being separated by the transparent sub-pixel area, with each red sub-pixel area located between two transparent sub-pixel areas, and each green sub-pixel area being located between two transparent sub-pixel areas;
    the color filter layer comprising an organic transparent photo-resist layer, a red quantum dot layer and a green quantum dot layer disposed on the transparent sub-pixel area, the red sub-pixel area and the green sub-pixel area, respectively;

the red quantum dot layer and the green quantum dot layer being formed with a quantum dot ink comprising a red quantum dot material and a green quantum dot material respectively by a sputter printing process using the organic transparent photo-resist layer as a stop wall.

10. A liquid crystal display (LCD) apparatus, which comprise: an LCD panel, and a backlight module disposed below the LCD panel; wherein:

the LCD panel comprising the aforementioned QD color film substrate as claimed in claim 9, an array substrate, and a liquid crystal (LC) layer disposed between the color film substrate and the array substrate; and the light source of the backlight module being a blue light-emitting diode (LED), with a wavelength between 450-480 nm.

\* \* \* \* \*